(12) United States Patent
Thakkar et al.

(10) Patent No.: US 11,876,145 B2
(45) Date of Patent: Jan. 16, 2024

(54) SOLAR PANEL PLANT FOR MAKING LAMINATED SOLAR PANEL PRODUCT HAVING PREFORMED SUBSTRATE WITH CONVEX SURFACE AND METHOD FOR CONTINUOUSLY PROCESSING THE SAME

(71) Applicant: APTERA MOTORS CORP., San Diego, CA (US)

(72) Inventors: Anuj M. Thakkar, San Diego, CA (US); Nathan T. Engler, San Diego, CA (US); Reed Thurber, San Diego, CA (US); Jesse H. Wood, San Diego, CA (US)

(73) Assignee: APTERA MOTORS CORP., San Diego, CA (US)

( * ) Notice: Subject to any disclaimer, the term of this patent is extended or adjusted under 35 U.S.C. 154(b) by 0 days.

(21) Appl. No.: 18/168,274

(22) Filed: Feb. 13, 2023

(65) Prior Publication Data
US 2023/0261133 A1    Aug. 17, 2023

Related U.S. Application Data

(60) Provisional application No. 63/345,419, filed on May 24, 2022, provisional application No. 63/309,581, filed on Feb. 13, 2022.

(51) Int. Cl.
*H01L 31/18* (2006.01)
*H01L 31/048* (2014.01)
(Continued)

(52) U.S. Cl.
CPC .......... *H01L 31/1876* (2013.01); *B32B 3/266* (2013.01); *B32B 37/02* (2013.01);
(Continued)

(58) Field of Classification Search
CPC ............. H01L 31/1876; H01L 31/0488; H01L 31/188; B32B 3/266; B32B 37/02; B32B 38/0004
See application file for complete search history.

(56) References Cited

U.S. PATENT DOCUMENTS 8,790,951 B2    7/2014 Safir
8,865,487 B2 *  10/2014 Kostka .................. B32B 37/003
438/26
(Continued)

*Primary Examiner* — Michael Jung
(74) *Attorney, Agent, or Firm* — Wasserbauer Law, LLC; Nicholas E. Blanton, Esq.; Damian G. Wasserbauer, Esq.

(57) ABSTRACT

The invention relates to improved methods and implementation of reliably manufacturing laminated solar panel products having one or more axis of curvature, wherein at least one solar cell also has one or more axis of curvature, in a manufacturing plant, the manufacturing plant being capable of continuous, optimized operation. A substrate and a superstrate having a doubly-curved geometry may be assembled with a core disposed therebetween, the core comprising a solar cell array including at least one solar cell. During the lamination process, the plant substantially eliminates cracking of the at least one solar cell of the solar array through controlled and uniform application of lamination pressure and temperature that applies uniform local pressure simultaneously to each cell, resulting in a durable and reliable product. The invention further relates to a plant and/or facility having efficient, effective, and repeatable results relating to such methods.

14 Claims, 10 Drawing Sheets

(51) Int. Cl.
B32B 37/02 (2006.01)
B32B 3/26 (2006.01)
B32B 38/00 (2006.01)
B32B 27/36 (2006.01)
B32B 27/32 (2006.01)
B32B 27/30 (2006.01)
B32B 27/28 (2006.01)
B32B 27/40 (2006.01)
B32B 27/08 (2006.01)

(52) U.S. Cl.
CPC ...... *B32B 38/0004* (2013.01); *H01L 31/0488* (2013.01); *H01L 31/188* (2013.01); *B32B 27/08* (2013.01); *B32B 27/283* (2013.01); *B32B 27/30* (2013.01); *B32B 27/304* (2013.01); *B32B 27/306* (2013.01); *B32B 27/32* (2013.01); *B32B 27/325* (2013.01); *B32B 27/36* (2013.01); *B32B 27/365* (2013.01); *B32B 27/40* (2013.01); *B32B 2250/40* (2013.01); *B32B 2274/00* (2013.01); *B32B 2323/10* (2013.01); *B32B 2327/06* (2013.01); *B32B 2329/06* (2013.01); *B32B 2331/04* (2013.01); *B32B 2333/12* (2013.01); *B32B 2367/00* (2013.01); *B32B 2369/00* (2013.01); *B32B 2375/00* (2013.01); *B32B 2607/00* (2013.01)

(56) References Cited

U.S. PATENT DOCUMENTS

| | | | |
|---|---|---|---|
| 2011/0226312 A1* | 9/2011 | Bohm | B62D 25/06 136/251 |
| 2018/0198011 A1* | 7/2018 | Jeon | H01L 31/02 |
| 2022/0324537 A1* | 10/2022 | Vénec | H02S 20/00 |
| 2022/0360211 A1* | 11/2022 | Griffith | H02S 20/23 |

* cited by examiner

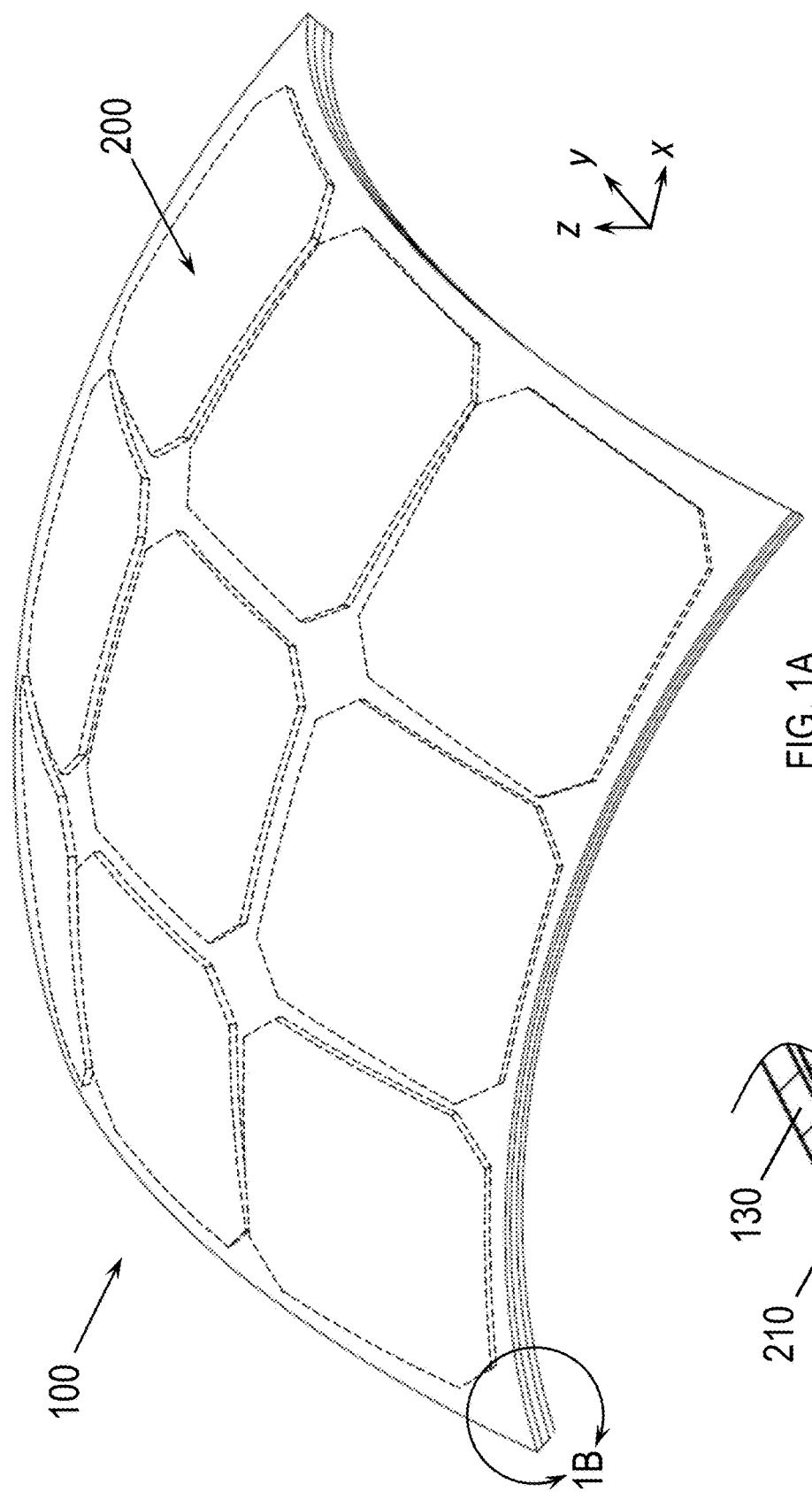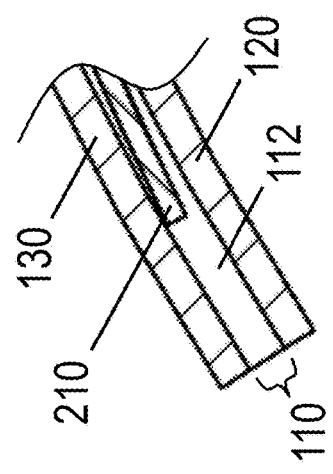

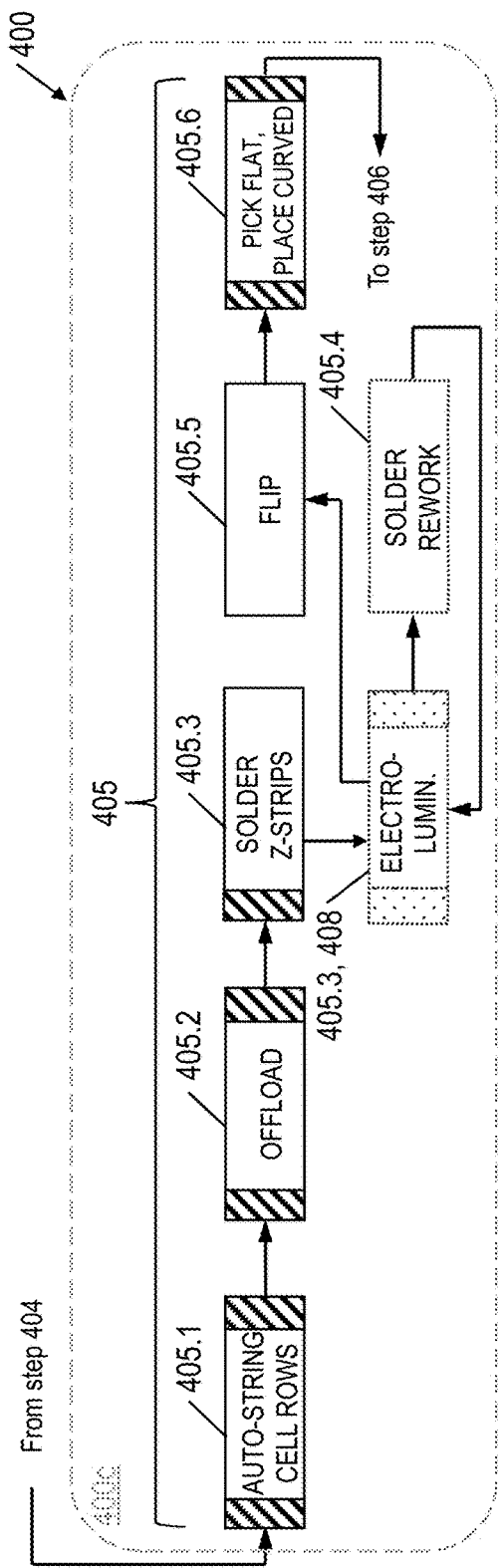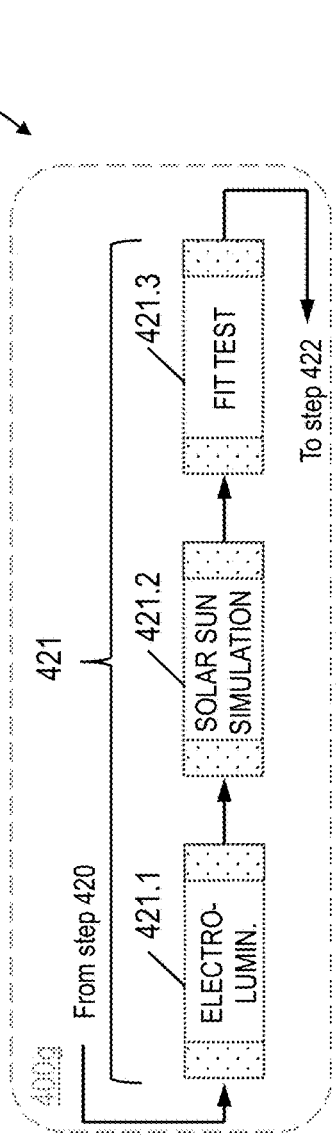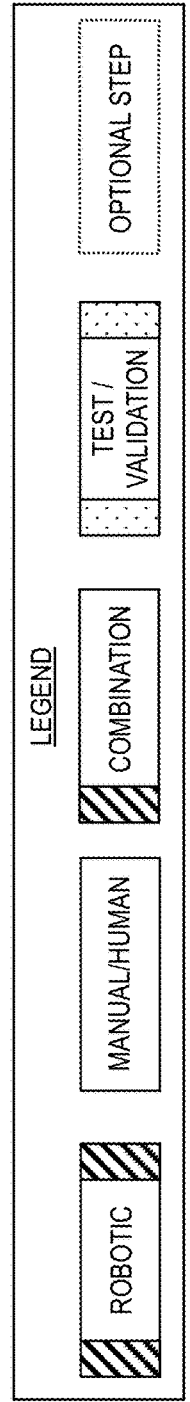

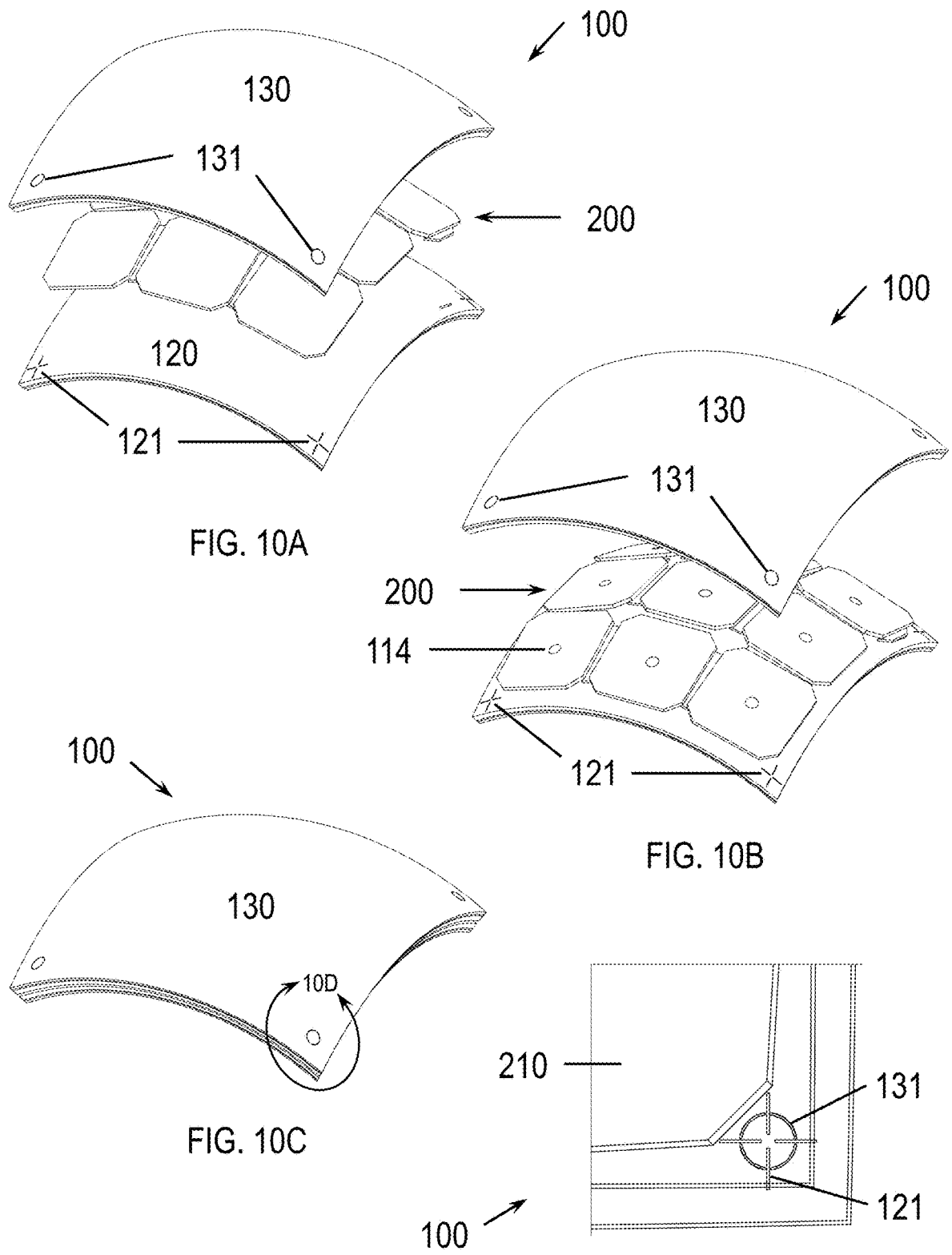

SOLAR PANEL PLANT FOR MAKING LAMINATED SOLAR PANEL PRODUCT HAVING PREFORMED SUBSTRATE WITH CONVEX SURFACE AND METHOD FOR CONTINUOUSLY PROCESSING THE SAME

CROSS-REFERENCE TO RELATED APPLICATION

This application claims priority to, and the benefit of U.S. Provisional Patent Application No. 63/309,581, filed on Feb. 13, 2022, entitled "Plant Continuous Process For Making Laminate Solar Panels", and U.S. Provisional Patent Application 63/345,419, filed on May 24, 2022, entitled "Curved Laminated Solar Panel With Improved Interlayer Adhesion And Method Of Manufacture Thereof", which are incorporated by reference in their entirety.

TECHNICAL FIELD

The invention relates generally to methods for producing laminated solar panel products having one or more axis of curvature, wherein at least one solar cell also has one or more axis of curvature, in a manufacturing plant, the product being produced in the manufacturing plant in a number of manufacturing stations and being moved between successive manufacturing stations accordingly. The invention also relates to a corresponding manufacturing plant.

BACKGROUND

Solar panels that match a complex geometry are challenging to build for a variety of reasons. The primary reason for failure, for instance, may be attributed to the stress caused by simple or complex bending, torsion, or other deformation within the cell, which exceeds the ultimate strength of the material, leading to brittle failure. For example, the forced deformation of silicon cells to synclastic, anticlastic, or partially twisted surfaces leads to particularly high internal stresses that will lead to immediate or premature failure. These and other modes of failure may occur during the manufacturing process or once the solar panel is in use.

During the manufacturing process, a solar panel may incur damage to the solar cells embedded within the panel, should the assembly experience a high enough temperature gradient, which can cause the cells to crack. Solar panels typically include layers of dissimilar materials that expand and contract at different rates when formed, which may be attributable to the coefficient of thermal expansion of the respective materials, as well as each material's proximity to the heat source. In a non-planar solar panel, the solar cells may be subjected to a more complex distribution of temperature and stress.

Once in use, a solar panel may be susceptible to damage from the elements, which represents a risk to the solar panel's electrical output and longevity. First, water vapor transmission represents a risk to solar panels. Ingress of moisture or water vapor into a solar panel typically occurs along the perimeter of the laminated panel, but may also occur through the laminate layers; if designed improperly, migration through the laminate layers may be the primary mode of ingress. The use of laminates that can reduce water vapor transmission or moisture ingress is critical. Once moisture enters a laminated assembly, thermal cycling of the moisture can damage the solar panel, for example due to shear stresses at material interfaces due to mismatched coefficients of thermal expansion or due to freeze-thaw cycling of moisture. The moisture can also cause corrosion of the cell materials due to corrosion of conductive contacts. Moisture can also degrade anti-reflective coatings on solar cells. And over time, moisture ingress may cause the laminated layers to peel apart.

A second risk to solar panels arises from potential impacts on the solar panel from hail, rocks, and other foreign objects. A standard test for validating a solar panel's impact resistance is called the hail impact test, wherein a ball of ice, about 25 mm diameter minimum, or about 1 inch, will be accelerated to the surface of the panel, hitting it at approximately 23 m/s, or about 52 mph. See: Ref. No. 61215, International Electrotechnical Commission (IEC). A successful test will demonstrate no damage to the solar cell. When damaged, solar cells will often not exhibit physical cracks detectible by most methods; but rather, exhibit microcracks in the mono-crystalline structure. These may be made apparent through a process called electroluminescence imaging. This process involves applying a voltage to one or more cells, which causes emission of light from the cell. Infrared light may be detected and captured, which may illustrate microcracks in the solar cell that otherwise are not visible to the naked eye. This may be an indicator of whether the solar cell is damaged, and may be correlated to the output of the cell, and the resulting reduction in electrical output thereof.

A third risk, specific to vehicular solar panels, is that the top layer is easily cracked, nicked and/or dented from airborne road debris (a scarring sometimes referred to as "road rash"), thereby reducing the visual appeal of the body panel. It is therefore advantageous to be able to choose the exterior layer of the solar panel based on expected environmental exposure.

The occurrence of any of these conditions may negatively impact the solar panel, by decreasing the solar cell's electrical output and associated efficiency, or by reducing the longevity or useful lifetime of the solar panel.

In the field of electric vehicles, the use of solar panels presents additional challenges. For one, the use of conventional solar panels represents added weight to the vehicle, which limits the range of the electric vehicle and its overall efficiency. And for another, the body design of a desirable vehicle typically includes complex geometry, that may contain multiple axes of curvature throughout the surface of automobile, such as along the surface of the roof, hood, or trunk.

Despite strong incentives across a variety of industries, there remains a long-felt need for a plant for manufacturing a solar panel curved in one or more axes, the plant being capable of continuous output. It would also be beneficial to have a plant designed to optimize manufacturing efficiency and reduce production time. Furthermore, it would be beneficial to have a continuous manufacturing plant capable of joining layers in a lamination stack wherein adhesion of the layers is improved, surface waviness is avoided, manufacturing is simplified, and time, energy consumption and cost are reduced.

SUMMARY

The present invention is directed to an apparatus, system, and method for a plant for manufacturing a solar panel curved in one or more axes, the plant being capable of continuous output. The present invention provides for a plant for manufacturing a solar panel product having one or more axes of curvature, wherein the solar cells also have one or more axes of curvature. Such a plant comprises at least one apparatus, one or more systems, and one or more methods for manufacturing a solar panel product. Applications of the solar panel product may include battery storage or power to devices in remote locations, which may include fields such as electric vehicles, buildings, aerospace devices such as satellites, telecommunications equipment, lighting, small electronic devices, avionics, and the like.

This disclosure solves the aforementioned problems via the use of thin, rigid preforms to gently and uniformly bend the solar cell(s) along two orthogonal directions. The preforms may comprise a single or multiple layers wherein at least one layer is rigid. The preforms may be made of glass or polymer or a combination thereof, depending on the environmental exposure in the end-use application. A flexible adhesive layer may be used to encapsulate the solar cells and bond the preforms.

In a first approach according to the present invention, thermally- or chemically-strengthened glass may be used to sandwich the solar cells in a single- or doubly-curved solar panel. Thermally- or chemically-strengthened glass is generally resistant to impacts, nicks and dents, is optically transmissive, is immune to yellowing over time, and may be more cost-effective than polymer materials. However, producing a shaped glass solar panel is not necessarily straightforward as the strengthening process must be carried out after the preforming process.

In a second approach according to the present invention, one or more polymer layers may be used as preforms. Polymer layers can also be resistant to impacts, nicks and dents. However, some polymers, such as polycarbonate, are subject to yellowing over time and require special processing or protection to improve their stability, such as yellowing inhibitors or ultraviolet absorption layers. In additional approaches, various combinations of glass and/or polymer preforms may be used, where appropriate, to obtain the advantages of each material.

In one aspect of the present invention, highly-efficient solar electric vehicles may benefit from having true three-dimensional solar panels disposed thereon, wherein one or more solar cells of a solar cell array exhibit two orthogonal axes of curvature. Solar electric vehicles of this sort may take advantage of solar power to provide for some or all of the driving range of the vehicle. When not in use, complete or partial charging of the electric vehicle may be achieved when the vehicle's exterior surface is exposed to irradiated light, such as from the sun.

In another aspect of the present invention, a plant for manufacturing a solar panel reduces the temperature gradient across the lamination stack, thereby reducing and/or eliminating damage to the solar cells attributable to thermal stress induced on the cells to ensure cracking of the cells does not occur.

In another aspect of the present invention, a plant for manufacturing a solar panel reduces and/or eliminates the stress and/or strain imparted on one or more solar cells of the solar array attributable to direct or indirect contact of the cells by the surrounding layers, thereby ensuring that cracking of the cells does not occur. The processes described herein reduce and/or eliminate damage to the solar cells.

In another aspect of the present invention, a plant for manufacturing a solar panel reduces or eliminates water ingress within the layers of the laminated stack.

In another aspect of the present invention, a plant for manufacturing a solar panel produces a solar panel product capable of withstanding forces associated the hail impact test, wherein a ball of ice, about 25 mm diameter minimum, or about 1 inch, will be accelerated to the surface of the panel, hitting it at approximately 23 m/s, or about 52 mph.

In another aspect of the present invention, a plant for manufacturing a solar panel produces a solar panel product capable of withstanding forces associated with wear from vibration, as well as damage from misuse criteria, e.g., slamming the hatch or sitting on the hood, as may occur in conventional vehicle applications.

In another aspect of the present invention, a manufacturing process is described that may achieve at-scale production levels.

In another aspect of the present invention, the plant may achieve "just in time" capabilities and/or other manufacturing efficiency measures that reduce overall production time.

In another aspect of the present invention, the physical layout of the plant may be optimized for efficient manufacturing in terms of time to production and space required.

Other desirable features and characteristics will become apparent from the detailed description, drawings, abstract, and claims, when considered in view of this summary.

DESCRIPTION OF THE DRAWINGS

Non-limiting and non-exhaustive embodiments of the present invention are described with reference to the following drawings. In the drawings, like numerals describe like components throughout the several views.

For a better understanding of the present invention, reference will be made to the following Detailed Description, which is to be read in association with the accompanying drawings, which are incorporated in and constitute a part of this specification, show certain aspects of the subject matter disclosed herein, and, together with the description, help explain some of the principles associated with the disclosed implementations, wherein:

FIG. 1A illustrates a solar panel product that includes one or more thermally- or chemically-strengthened glass preforms, made by a process of a continuous plant for manufacturing, according to an embodiment of the present invention;

FIG. 1B illustrates the enlarged view of FIG. 1A, according to the embodiment of the present invention;

FIG. 4 illustrates an exemplary embodiment of assembling a solar cell array of the continuous plant of FIG. 3, according to the present invention;

FIG. 5 illustrates an exemplary embodiment of inspecting and validating a solar panel product produced by the continuous plant of FIG. 3, according to the present invention;

FIG. 10A illustrates a perspective view of laminate stack components prepared for alignment, according to an embodiment of the present invention;

FIG. 10B illustrates a perspective view of a solar cell array aligned to a substrate with a superstrate prepared for subsequent alignment, according to an embodiment of the present invention;

FIG. 10C illustrates a perspective view of a solar cell array and superstrate aligned to a substrate, according to an embodiment of the present invention; and FIG. 10D illustrates a plan detail view of a solar cell array and superstrate aligned to a substrate, according to an embodiment of the present invention.

DETAILED DESCRIPTION

Figure 1C:
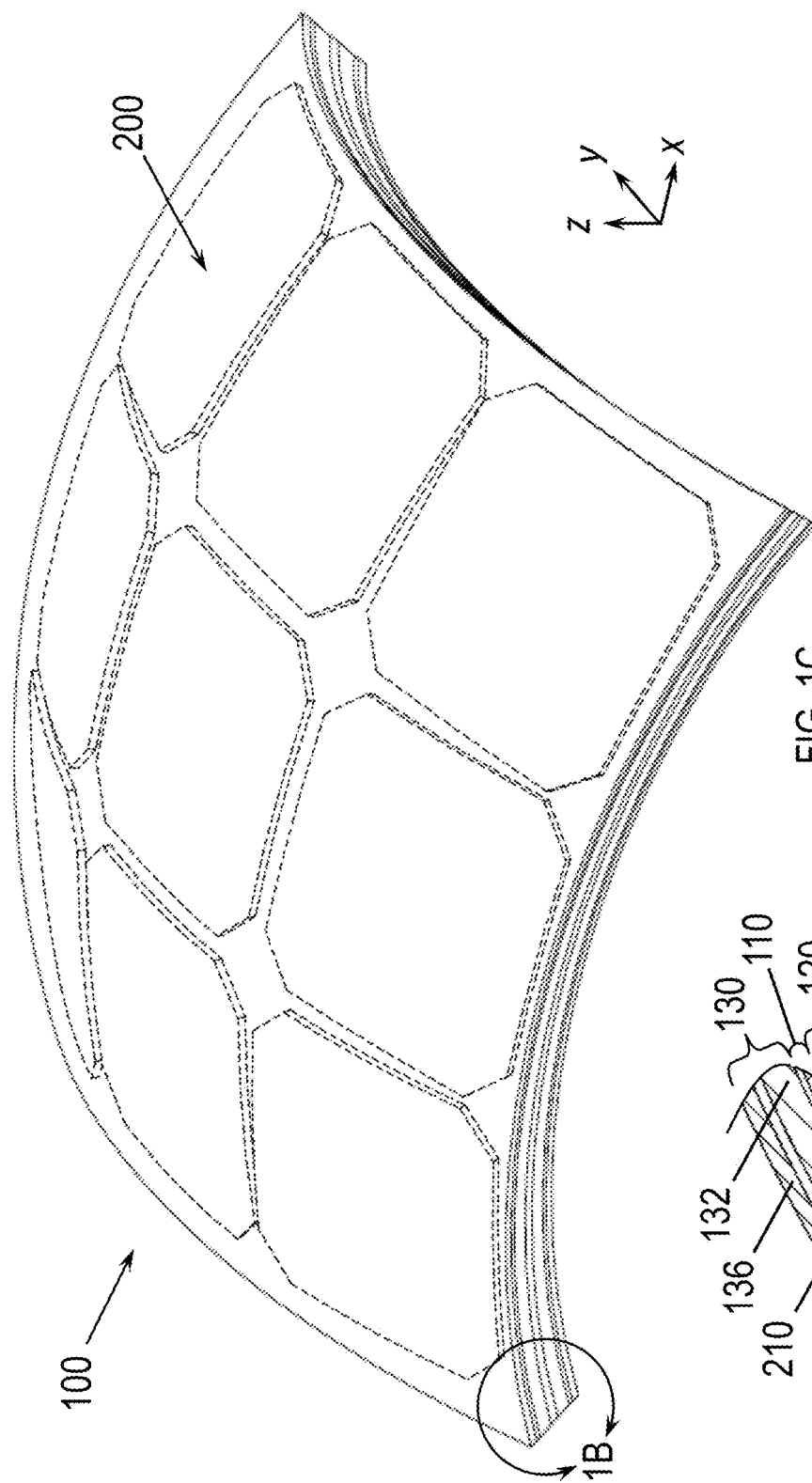
FIG. 1C illustrates a solar panel product that includes one or more preform comprising one or more polymer layers, made by a process of a continuous plant for manufacturing, according to another embodiment of the present invention.

Non-limiting embodiments of the invention will be described below with reference to the accompanying drawings, wherein like reference numerals represent like elements throughout. While the invention has been described in detail with respect to the preferred embodiments thereof, it will be appreciated that upon reading and understanding of the foregoing, certain variations to the preferred embodiments will become apparent, which variations are nonetheless within the spirit and scope of the invention. The drawings featured in the figures are provided for the purposes of illustrating some embodiments of the invention and are not to be considered as limitation thereto.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "some embodiments", "one embodiment", "certain embodiments", and "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

The term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein and use of the term "means" is not intended to be limiting.

In one embodiment, FIGS. 1A and 1B show an exemplary solar panel product 100 produced in accordance with one or more processes generally defined herein by a continuous process plant 400. In another embodiment, FIGS. 1C and 1D similarly show an exemplary solar panel product 100 produced in accordance with one or more processes generally defined herein by a continuous process plant 400. Therefore, solar panel product 100 as identified, described, and referenced throughout this disclosure may refer to a solar panel 100 comprising embodiments wherein the preformed substrate 120 and/or preformed superstrate include: (i) thermally- or chemically-strengthened glass and (ii) one or more polymer layers. Furthermore, any combination of (i) glass and/or (ii) polymer layers are considered as being within the scope of this disclosure. Regarding FIGS. 1A and 1B, a solar panel product 100 may include one or more core layers 110, one or more substrates 120, and one or more superstrates 130, where both the substrate 120 and superstrate 130 are shown as thermally- or chemically-strengthened glass. Regarding FIGS. 1C and 1D, a solar panel product 100 may include one or more core layers 110, one or more substrates 120, and one or more superstrates 130. According to FIGS. 1C and 1D, the substrate 120 may include a substrate inner rigid layer 122, a substrate flexible, adhesive layer 124, and a substrate outer rigid layer 126. Similarly, the superstrate 130 may include a superstrate inner rigid layer 132, a superstrate flexible, adhesive layer 134, and a superstrate outer rigid layer 136.

According to either FIG. 1A, 1B or 1C, 1D, a core layer 110 of solar panel product 100 may have a plurality of solar cells 210 suspended within an encapsulant 112, wherein solar cells 210 define a solar array 200. The encapsulant 112 may comprise layers of polyolefin (POE) or similar material, or combination of materials, having binding properties including, but not limited to: polyvinyl butyral (PVB), thermoplastic polyolefin (TPO), ethylene-vinyl acetate (EVA), silicone, polyvinylidene difluoride (PVDF), and thermoplastic polyurethane (TPU).

Figure 1D:
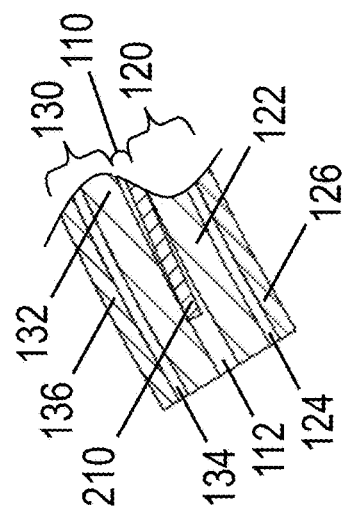
FIG. 1D illustrates the enlarged view of FIG. 10, according to the embodiment of the present invention.

Referring to the embodiment of solar panel product 100 shown in FIGS. 1C and 1D, the substrate inner rigid layer 122 of substrate 120 and the superstrate inner rigid layer 132 of superstrate 130 may be made of any suitably rigid material, primarily a material configured to provide mechanical stiffness and impact resistance; non-limiting examples include polycarbonate (PC), a polypropylene (PP) such as poly methyl methacrylate (PMMA), polyethylene terephthalate (PET), polyvinyl chloride (PVC), polyethylene or polythene (PE), cyclic olefin copolymer (000), and fluorinated ethylene propylene (FEP). The substrate flexible, adhesive layer 124 and the superstrate flexible, adhesive layer 134 may be of any suitable material, primarily a material configured to act as an adhesive layer or otherwise fixedly couple adjacent layers; non-limiting examples include: silicone adhesive and acrylic-based adhesive. A suitable acrylic-based adhesive (e.g., adhesive tape) is manufactured by 3M™ under product numbers PSA468MP, PSA467MP, or GT580NF. The substrate outer rigid layer 126 and the superstrate outer rigid layer 136 may also be made of any suitable material, primarily a material configured to provide an environmental barrier to vapors; non-limiting examples include: ethylene tetrafluoroethylene (ETFE) and ethylene chlorotrifluoroethylene (ECTFE).

Figure 2:
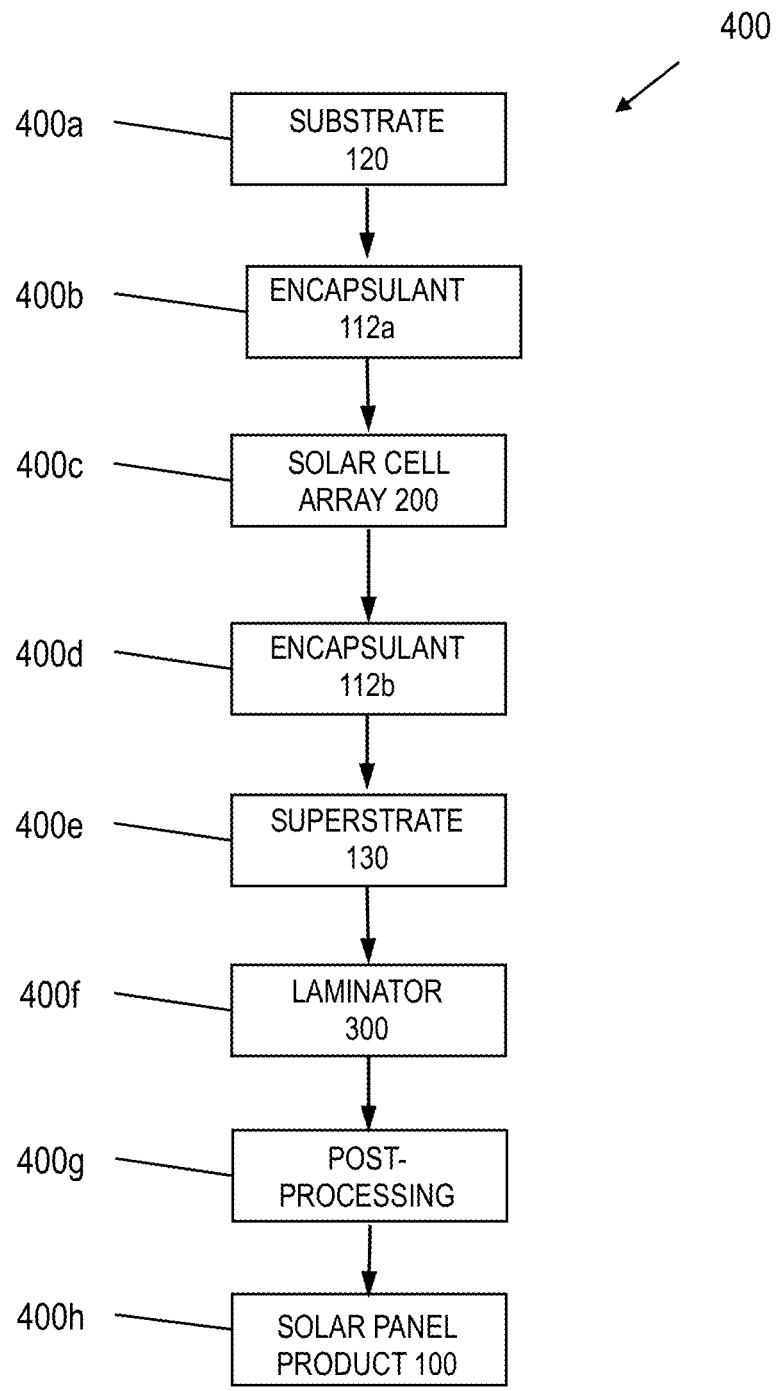
FIG. 2 illustrates a flowchart of a continuous plant for manufacturing a laminated solar panel product having a complex shape, according to an embodiment of the present invention.

FIG. 2 illustrates a flowchart corresponding to the continuous process plant 400 that provides an exemplary lamination stack and/or process according to the apparatus, system, and method of the present invention. One skilled in the art will appreciate that numerals 400a-400h may refer to the buildup of laminate layers to form a lamination stack; but also, these numerals may refer to process steps which themselves each may entail further process steps. First, a preformed substrate 400a may be provided, which may be the same as substrate 120 of FIGS. 1A and 1B or of FIGS. 1C and 1D. Regarding a preform comprising a thermally- or chemically-strengthened glass, as in FIGS. 1A and 1B, the glass may be formed and/or shaped using a variety of methods 400a as in FIG. 2. For example, a thermoforming technique, such as, vacuum forming, pressure forming, or drape forming may be used. The substrate 120 undergoes a thermal or chemical strengthening process. This process generally follows the forming process so that the compressive stress that gives the glass its strength is not compromised. The result of the process is a strengthened glass preform with a desired design. Either the substrate 120 or superstrate 130 or both may be processed in this manner, as reflected in process steps 400a and 400e of FIG. 2. Similarly, with reference to FIGS. 1C, 1D, and 2, a preformed substrate 400a or preformed superstrate 400e may include one or more polymer layers as previously described and may be formed using one or more processes, like laminating and thermoforming.

Generally, preformed substrate 400a and/or preformed superstrate 400e are preformed, in that one or more processes, such as thermoforming, have been applied to the layers comprising the polycarbonate to produce an assembly having a curved profile. The curved profile may comprise any shape, such as flat, or curved. A curved profile may comprise two axes of curvature, each axis having a distinct radius of curvature. For example, FIG. 1A illustrates a profile having one or more axes of curvature. Alternatively, the curved profile may comprise a spline-fitted curve having a more complex geometric profile. As will become clear, these preforming processes may generally be considered as inputs to the continuous plant 400 which produces solar panel product 100. Alternatively, the preforming processes may be considered as integral to the continuous plant 400 process.

As shown in FIG. 2, the preformed substrate 400a may first have a layer of encapsulant 400b disposed thereon. The encapsulant 400b, 400d, may be, for example polyolefin (POE), or other material as described with reference to encapsulant 112 of core layer 110 in FIG. 1A, 1B or 1C, 1D. The encapsulant 400b, 400d may be applied to a surface of the preformed substrate 400a, thereby forming a lamination stack, such that encapsulant 400b conforms to the contours or profile thereof. To facilitate placement, the encapsulant layer 400b may be sliced at various localized portions so that it conforms more readily to the preformed substrate 400a. Once the encapsulant layer 400b has been appropriately applied, a solar cell array 400c may be disposed on the exposed surface of the encapsulant layer 400b. The solar cell array 400c may take the shape and appearance of solar cell array 200 of FIGS. 1A and 1B or FIGS. 1C and 1D, wherein array 400c comprises a plurality of cells 210. Alternatively, solar cell array 400c may be formed in a diamond-shaped array, or any other arrangement. As another alternative, solar cell array 400c may refer to a single cell, or may refer to two or more cells. The solar cell array 400c may be tacked in place by applying a heating element to localized portions of one or more cells 210 of array 400c, so that the solar cell array 400c generally assumes and conforms to the profile of the substrate 400a, primarily so that the solar cells 210 do not move location with respect to substrate 400a, or other defined set of coordinates. In one embodiment, heat may be applied to a center of each solar cell 210, respectively. The heat emanating through solar cell 210 may cause a localized portion of the encapsulant 400b to partially cure, thereby allowing said solar cell 210 to attach, or otherwise adhere to the lamination stack.

Also as shown in FIG. 2, the solar panel product 100 includes solar cells 210 forming solar array 200, i.e., solar cell array 400c, wherein the solar cells 210 may be of any suitable type or manufacture that achieves one or more of the problems solved by the present invention. Solar cells 210 may be a solar cell produced by Maxeon®, such as the Gen III (3) flexible solar cell. Problems solved by the invention may include yield loss in manufacturing, or field failure of a cell or array of cells, due to the brittleness associated with the solar cell which is principally manifested by the formation and propagation of cracks in the crystalline structure. In one aspect, a cell that is electrically segmented into a plurality of zones may be employed to address, inter alia, the problem of reduced power output resulting from the formation of a crack within the cell. Such a cell may be made of silicon, gallium arsenide, or any other material suitable for the intended purposes herein. A microcrack in a solar cell may either reduce that cell's power output, or in most instances prohibit the solar cell from producing power entirely. By the same token, a solar cell having a microcrack may reduce or extinguish the power producing capability of a string or array of cells. A cell with a great degree of metal coverage and a thick metal layer will provide the benefit of increased bending without cracking relative to an unmetallized or under-metallized cell, thereby reducing the probability of crack initiation during manufacture and use. In addition, a cell with electrically segmented zones is more likely to limit the extent of power reduction, or to prevent total failure, if a fracture does develop relative to a cell in which there is only one electrical zone. In another aspect, a solar cell may be employed to address, inter alia, the problems associated with incorporation of brittle solar cells into a doubly curved solar panel. For example, two-axis flexion of a solar cell may cause the cell to crack or otherwise fail at a larger bending radius than single-axis flexion. Several factors enable the two-axis deformation of the solar cells, and thus their accommodation into the doubly curved laminated solar panel of the present disclosure. First, the thickness of the encapsulant POE layer allows for a reduced amount of cell bending, thereby reducing the stress on the cells and the probability of crack formation. The flowable polymer (POE) layers that sandwich the solar cells in the laminate stack allow some stress relaxation via an increased radius of curvature of the solar cell relative to the radius of curvature of the panel. Specifically, the cell distortion relative to the panel distortion is reduced by up to the total thickness of the upper and lower POE layers, e.g., 1 mm. A second contributing factor may be the thick copper electrode layers on the backside of the solar cells, which allow an additional amount of flexing of the silicon without breakage. Finally, the two-preform lamination process may provide advantages for bending the solar cells. The prior art often discloses one pre-formed layer or laminate that is placed into a matching female mold, followed by placement of a first flowable layer which takes the shape of the mold, the planar solar cells which do not take the shape of the mold but rather rest on three or four corners, a second flowable layer, and one or more backing layers in the form of planar sheets. During the lamination process, therefore, the flat/planar backing layers undergo a large deformation to take the shape of the mold. The large deformation occurs non-uniformly, reaching the solar cells first at the edges of the mold, then moving toward the center in an under-controlled fashion, leading to cell displacement and fracture. In this disclosure, the distance between the substrate and superstrate preforms and the solar cells is well defined and small. Upon application of the lamination pressure, all cells experience a uniform local pressure simultaneously, resulting in a well-controlled and reproducible deformation, thereby avoiding cell fracture.

Next in the flowchart according to FIG. 2, an additional layer of encapsulant 400d may be applied to the stack. One purpose of the encapsulant layers 400b, 400d is to surround, or otherwise encapsulate, the solar cell array 400c, so that the cells 210 become suspended therein once the stack is subjected to a thermal process, such as with the application of heat and/or pressure. Another purpose of the encapsulant layers 400b, 400d is to protect the cells 210 of the solar array 400c from damage throughout the manufacturing process and during the lifetime of the solar panel product 100. For at least these reasons and to achieve at least these objectives, the respective thicknesses of the encapsulant layers 400b, 400d may vary, and may be any suitable dimension. For example, encapsulant layers 400b, 400d may range from about 0.1 mm to about 2 mm. However, encapsulant layers 400b, 400d as thick as about 110 mm have been proven useful for certain applications, and the upper limit of said range(s) shall not be construed as a limiting factor. Said thicknesses may be non-uniform, or variable. Furthermore, the thickness of layer 400b may be substantially the same as that of layer 400d, or may be greater or smaller. And in an analogous manner, the layer of encapsulant 400d may be sliced or otherwise modified to facilitate placement of the same too the stack.

Next in the flowchart according to FIG. 2, following the placement of encapsulant layer 400d, a preformed superstrate 400e may be provided, which may take the shape and composition as superstrate 130 described with respect to FIGS. 1A and 1B or 1C and 1D. Superstrate 400e may be of a complimentary shape, i.e., profile, as that of substrate 400a. Proper alignment of the PC layer 400e to the stack through mechanical or mechatronic means ensures that the complementary profiles of substrate 400a and superstrate 400e form the nested shape and that proper lamination and/or sealing of the stack occurs.

Once the stack has been properly assembled as defined by the layers corresponding to the steps 400a-400e in the representative flowchart of FIG. 2, the lamination stack may be moved into a laminator 300, defined generally as lamination step 400f. In particular, the elements 120, 112, 200, 112, and 130 corresponding to process steps 400a, 400b, 400c, 400d, and 400e, respectively, may be arranged, i.e., superposed, according to the order shown in FIG. 2 to form the lamination stack. The lamination stack may then be subjected to the curing cycle in the laminator 300, and the cycle may be defined as the amount of time one lamination stack enters the laminator 300 until the next lamination stack enters the laminator 300, again corresponding to 400f. In one embodiment, the lamination cycle 400f totals about 20-30 minutes, wherein the entire lamination process occurs, i.e., application of a vacuum, raising the stack to a uniform temperature of about 155° C., and subsequently applying a uniform pressure. In a preferred embodiment, the lamination cycle lasts about 25 minutes. The lamination cycle may include: loading the lamination stack into the laminator 300, applying a vacuum to lamination chamber, preheating the lamination stack, applying pressure to the lamination stack, holding the lamination conditions, restoring the chamber to load/upload conditions, and unloading the laminated panel from the chamber. Upon completion of the curing cycle, the encapsulants 124, 134, of the preformed substrate 120 and preformed superstrate 130 will have undergone a total thermal cycle of, in one embodiment, about 25 minutes, and therefore subjected to its specific optimum curing time, thereby ensuring that each layer is neither under- nor over-cured. According to the present invention a single curing cycle, corresponding to the cross-linking of polymers comprising encapsulant 112, may be relied upon to form the finalized solar panel product 100. For a given encapsulant, such as POE comprising a specific chemical composition, the manufacturer may specify for that POE a time-dependent curve over which cross-linking occurs. Such a time-dependent curve may be specified for a given temperature, for example a curing temperature of about 155° C. The curve may further identify a time at which optimum cross-linking occurs. After said optimum time, degradation may occur, wherein the cross-linked layers become denatured. The transmittance of the combined layers may also be negatively impacted when the layers are over-cured, or under-cured. Furthermore, the optimum transmittance achieved may, or may not, be coincident with the optimum cross-linking time, as specified by the time-dependent curve. However, these characteristics are generally specified by the manufacturer.

Next in the flowchart according to FIG. 2, after a curing cycle according to the processes described above, the lamination stack may undergo one or more post-processing steps 400g. The completion of one or more post-processing steps 400g may then result in a solar panel product 400h. Furthermore, the solar panel product 400h may be defined according to the description of solar panel 100 as shown and described in FIGS. 1A and 1B or 1C and 1D.

Figure 3:
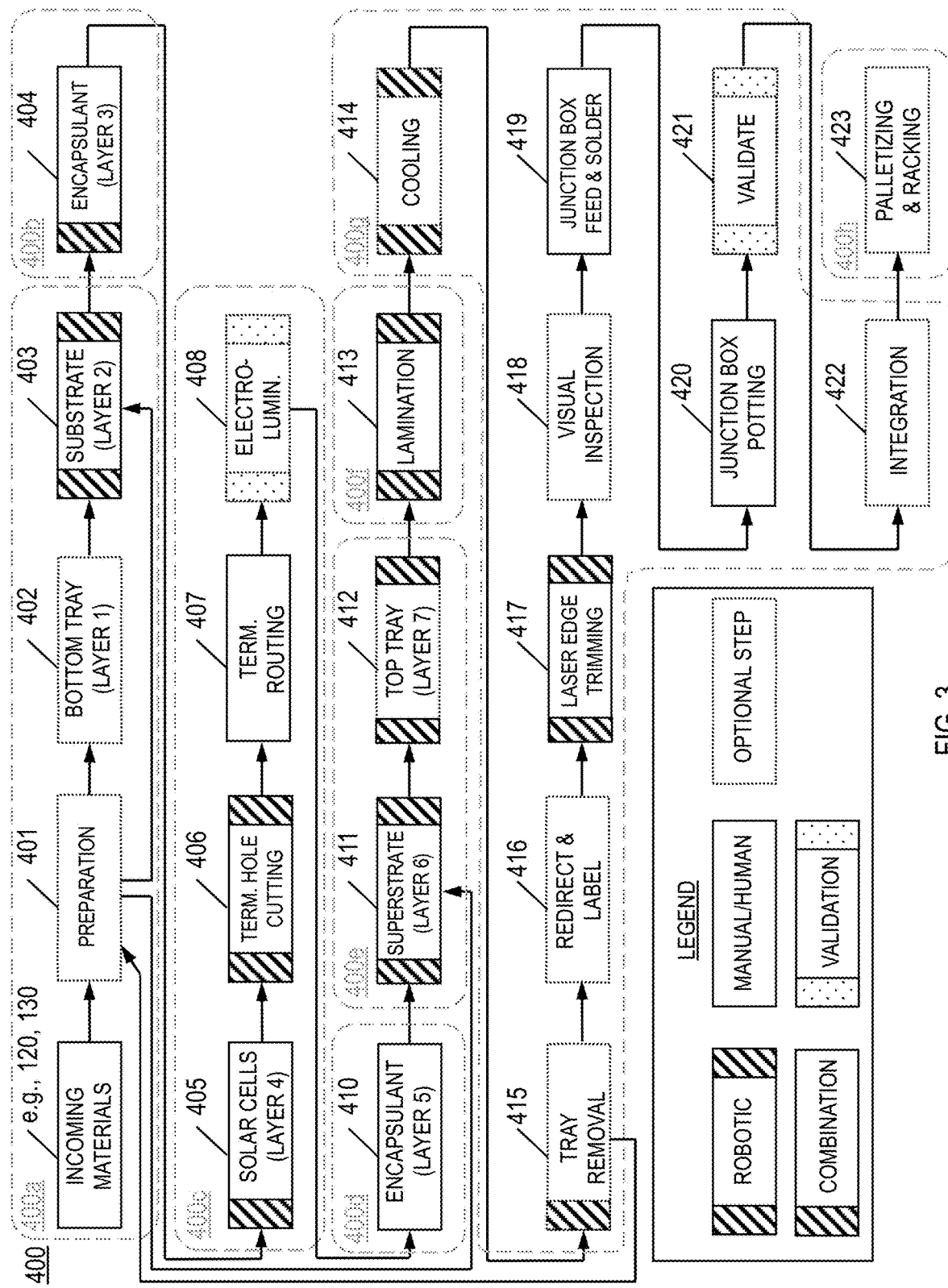
FIG. 3 illustrates an exemplary embodiment of the flow chart of the continuous plant of FIG. 2, according to the present invention.
Figure 6:
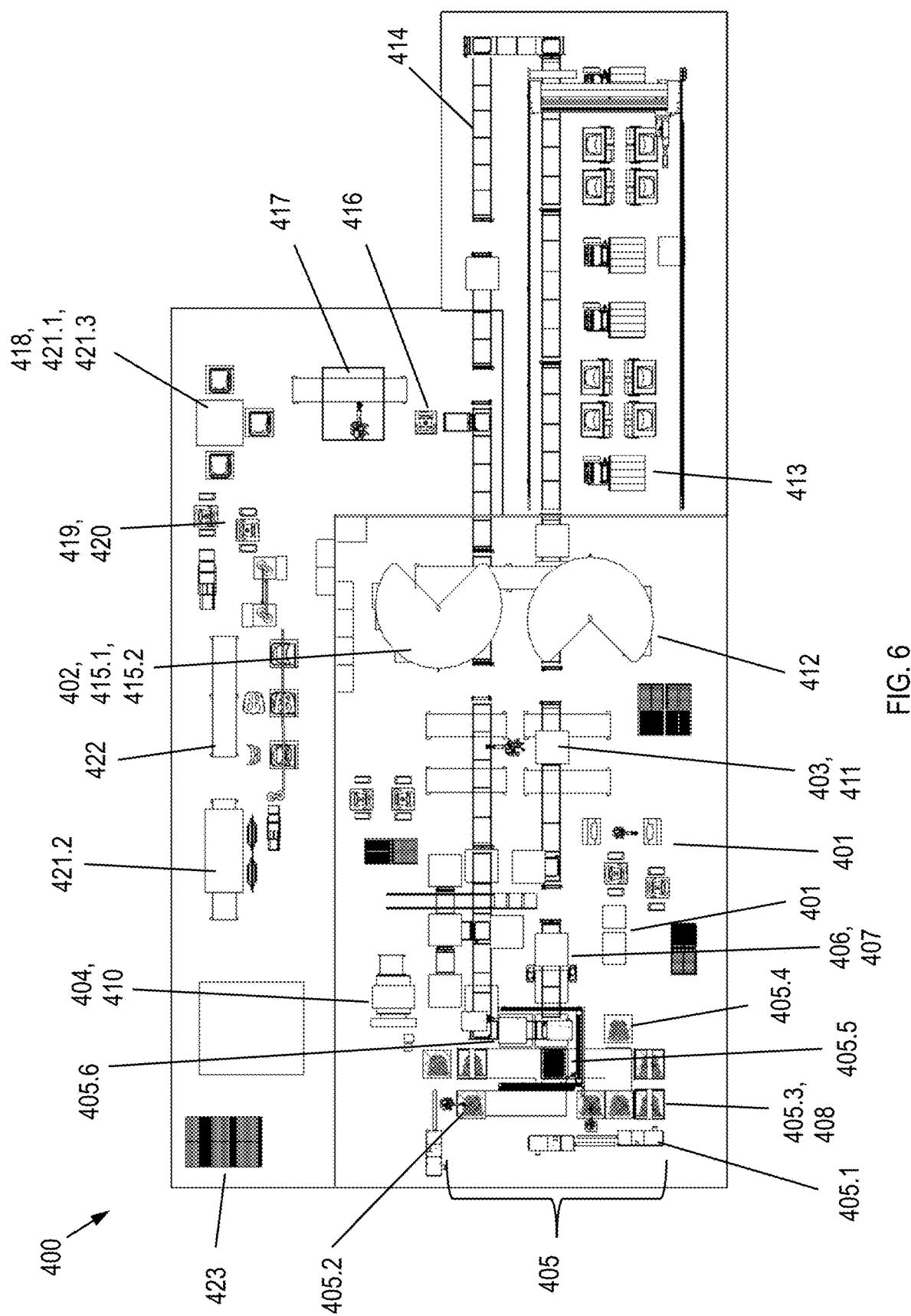
FIG. 6 illustrates a plan view of an exemplary continuous plant for manufacturing, according to an embodiment of the present invention.
Figure 7:
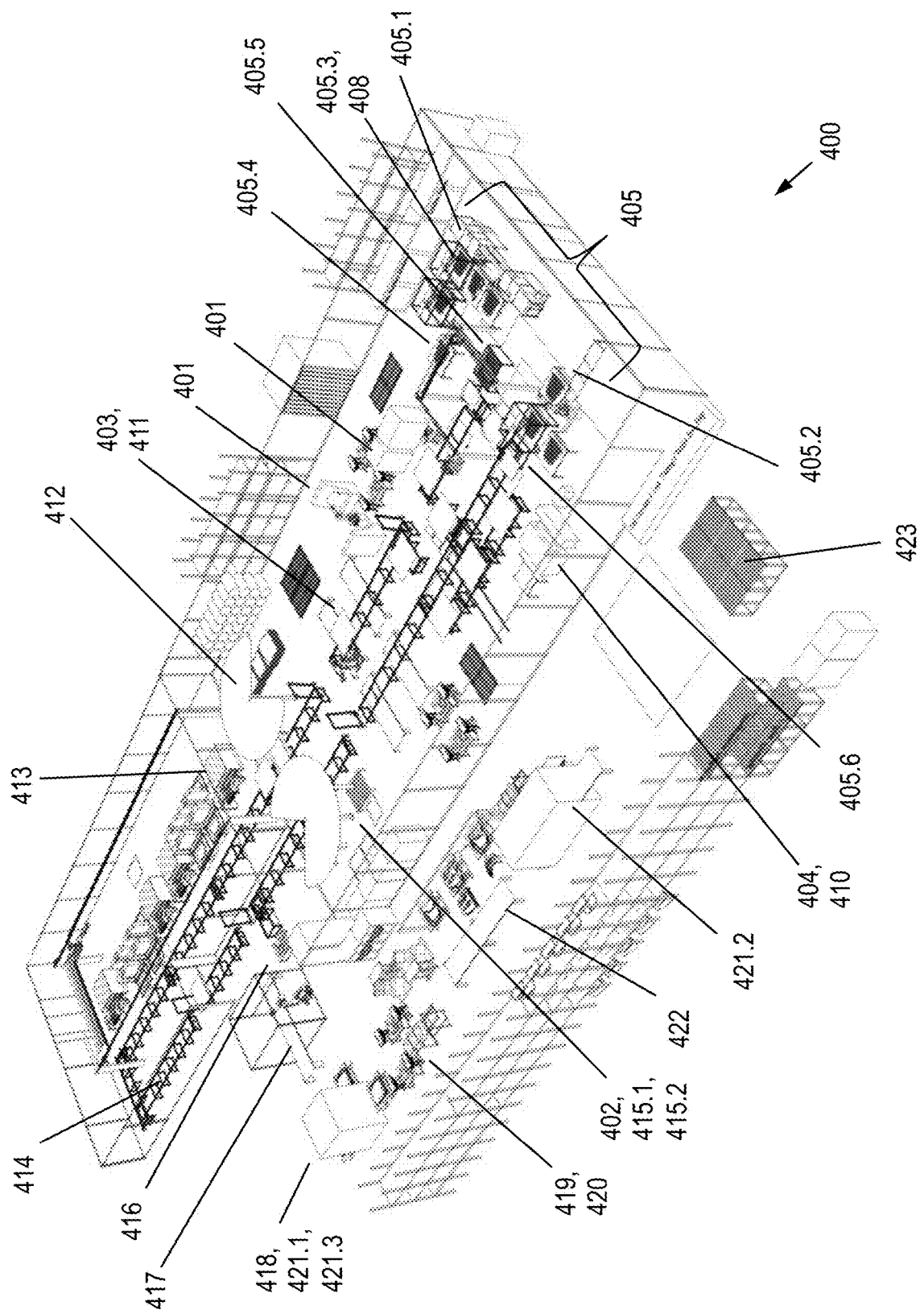
FIG. 7 illustrates a perspective view of an exemplary continuous plant for manufacturing, according to an embodiment of the present invention.

Turning now to FIG. 3, an exemplary embodiment of the flowchart described in FIG. 2 is illustrated. As may be observed, each process step 400a-400h may be further described or defined in terms of additional method steps and/or physical plant stations, the latter of which is depicted in FIGS. 6 and 7. Furthermore, additional steps corresponding to process steps 400c and 400f may be observed in FIGS. 4 and 5, respectively. The Legend shown for FIGS. 3-5 illustrate whether a particular step is performed robotically, manually, a combination thereof, or corresponds to a test or validation step; these modes of operation in manufacturing—robotic, manual, combination, test/validation—are provided for illustrated purposes as one enabling example of how plant 400 may be deployed in operation. Therefore, said modes of operation are to be construed as non-limiting, and may be deployed in other ways, or otherwise interchanged.

With respect to the order of operations illustrated in FIGS. 3-5, any suitable order of process steps may be used to achieve the desired objective outlined herein, i.e., a continuous plant 400 to produce a solar panel product 100. Therefore, the order of operations shown in FIGS. 3-5 are non-limiting, and are provided for illustrative purposes. In particular, the steps considered optional have been provided with a dashed box, including but not limited to: preparation 401; bottom tray 402; EL test 408; top tray 412; active or passive cooling 414; tray removal 415; inspect & validate 418 and/or 421; integration 422; palletizing & racking 423; EL test 408 and solder rework 409; and each step comprising 421—421.1, 421.2, 421.3. Additionally, any suitable alternative for the junction box supplied at step/station 419 may be utilized, such as for example, a free-standing connector, or other connection type. As another example, placing edge trimming 417 after junction box feed and solder 419 offers no functional difference in the process.

As shown in FIG. 3, incoming materials may include substrate 120 and superstrate 130, which may be subjected to preparation steps 401. In step/station 401, the incoming materials, e.g., 120, 130, are prepared, and any trays that may have been used in a previous manufacturing cycle are cleaned for reuse. The type of preparation and/or cleaning depends on the material characteristics of the preform 120, 130. For substrate 120 or superstrate 130 comprising hygroscopic polymers, a pre-bake process may be necessary, wherein the preforms are subjected to heat to remove any moisture. In one embodiment, the pre-bake preparation process involves inserting the preforms into a drying oven, and subjecting the preforms to about 100° C. for a period of about 24 hours. For either thermally- or chemically-strengthened glass preformed substrate 120 or superstrate 130, or for polymer-based substrate 120 or superstrate 130, the cleaning process may involve an alcohol cleaning process. Alternatively, or additionally, a UV stabilized cleaning process may be employed. A cleaning process is crucial for maintaining the operational effectiveness of each solar panel 100 throughout its lifetime; for example, the hygroscopic preforms 120, 130 will naturally attract particulates from the atmosphere once removed from the drying oven. Also, particulates or other foreign matter may trap air bubbles, or otherwise cause delamination in the fully laminated solar panel and therefore must be removed. Particulates and other foreign matter may be removed by manual cleaning of the substrate 120 or superstrate 130 using, for example, isopropyl alcohol and microfiber cloth. In addition to pre-baking or alternatively for non-hygroscopic polymers, surface treating via an adhesion promotion process may be employed after the cleaning process. Many plastics have chemically inert and nonporous surfaces with low surface energy causing them to be non-receptive to bonding with adhesives. For these materials surface treating, such as with an atmospheric plasma or corona, may be used to improve adhesion by increasing the surface energy through the creation of dangling chemical bonds. Here, the top side of the polymer substrate 120 and the bottom side of the polymer superstrate 130 may be cleaned and then treated with an atmospheric plasma or corona to improve adhesion with the POE encapsulant 112. Thermally- or chemically-strengthened glass substrates 120 and/or glass superstrates 130 are typically not surface treated after cleaning, nor subjected to a pre-bake process. Additionally, an initial sizing and/or fit-check may be desirable at this step. For those embodiments employing trays, the preparation process may also require cleaning from a previous manufacturing process, prior to reuse. Trays may be made from aluminum, for example, and stored on an automated turntable fed by a rework station comprising a portion of step/station 402. Rework of the trays may involve scraping off any excess residual material, and preparing for reuse through an application of Teflon tape disposed around the perimeter of the tray, optionally a heating and/or alcohol cleaning process. A spray may be disposed on the bottom or top tray along the surface exposed to the preformed substrate 120 or superstrate 130.

Figure 8:
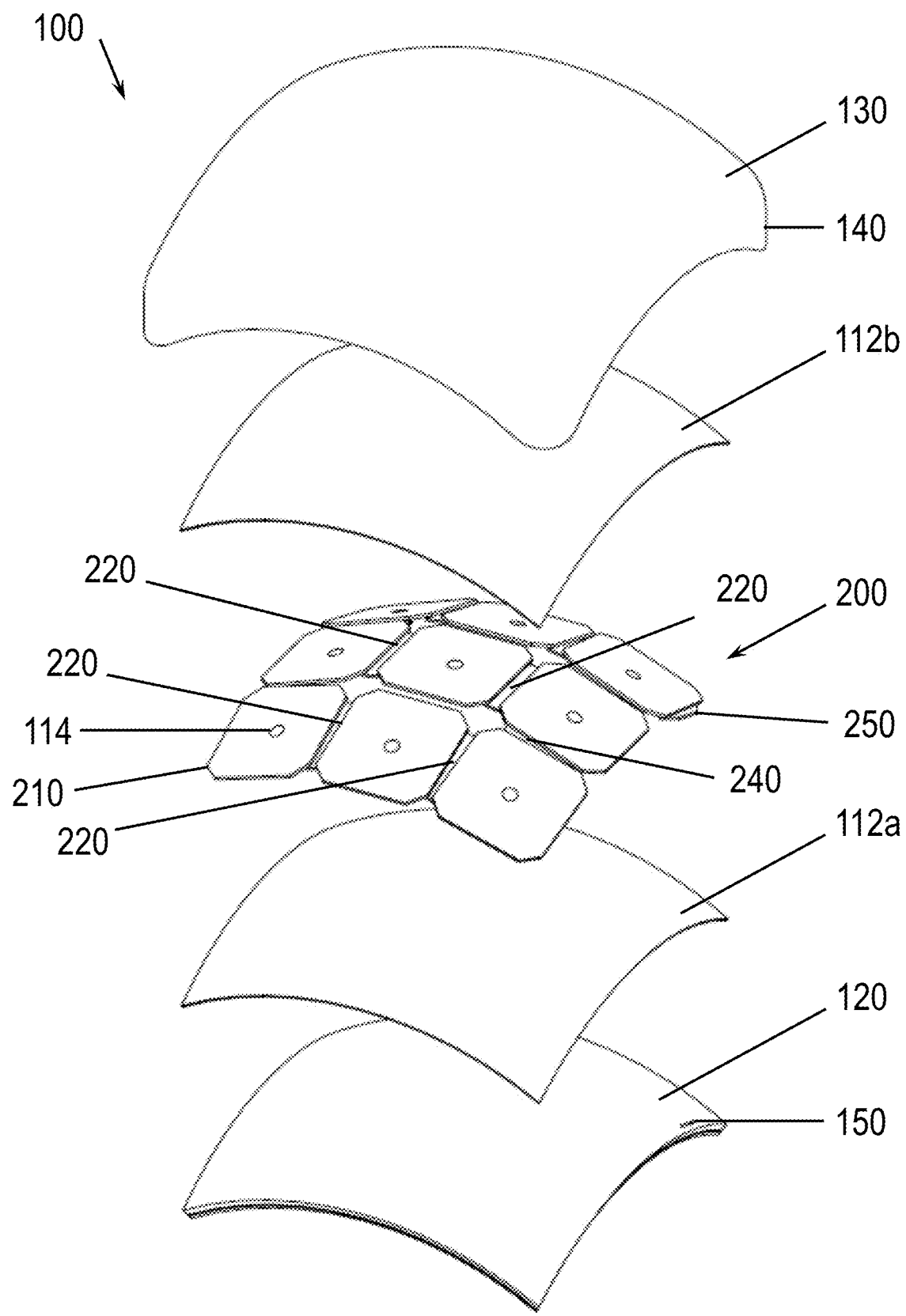
FIG. 8 illustrates an exploded perspective view of a solar cell array including a superstrate having a flange and other layers, according to an embodiment of the present invention.
Figure 9A:
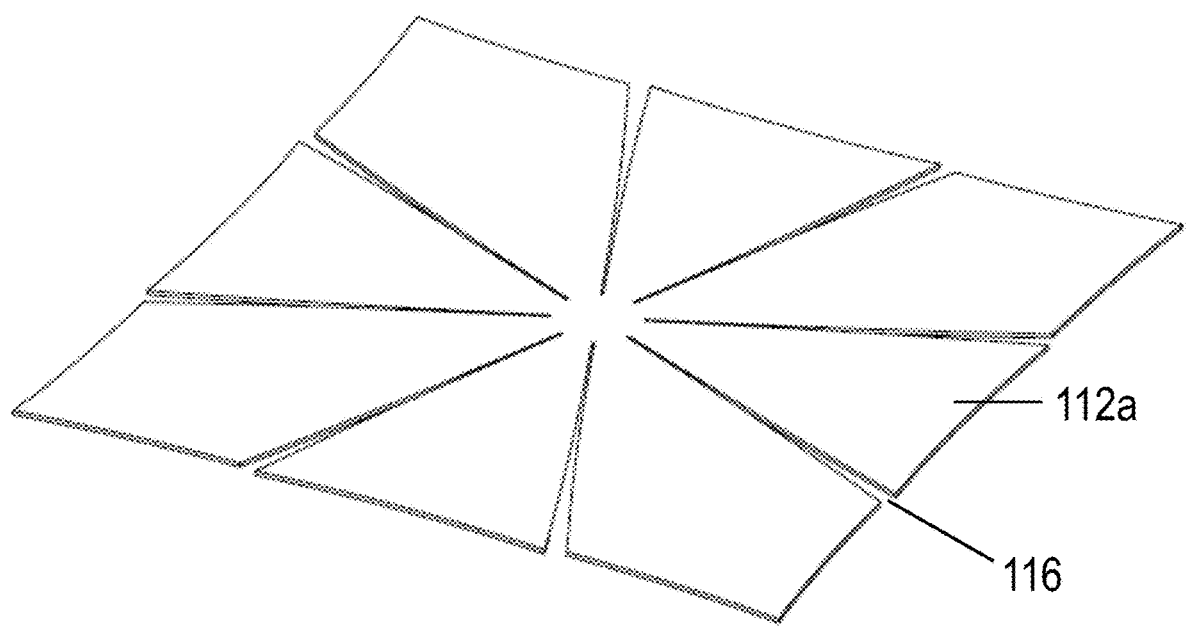
FIG. 9A illustrates a perspective view of an encapsulate sheet with relief cuts, according to an embodiment of the present invention.
Figure 9B:
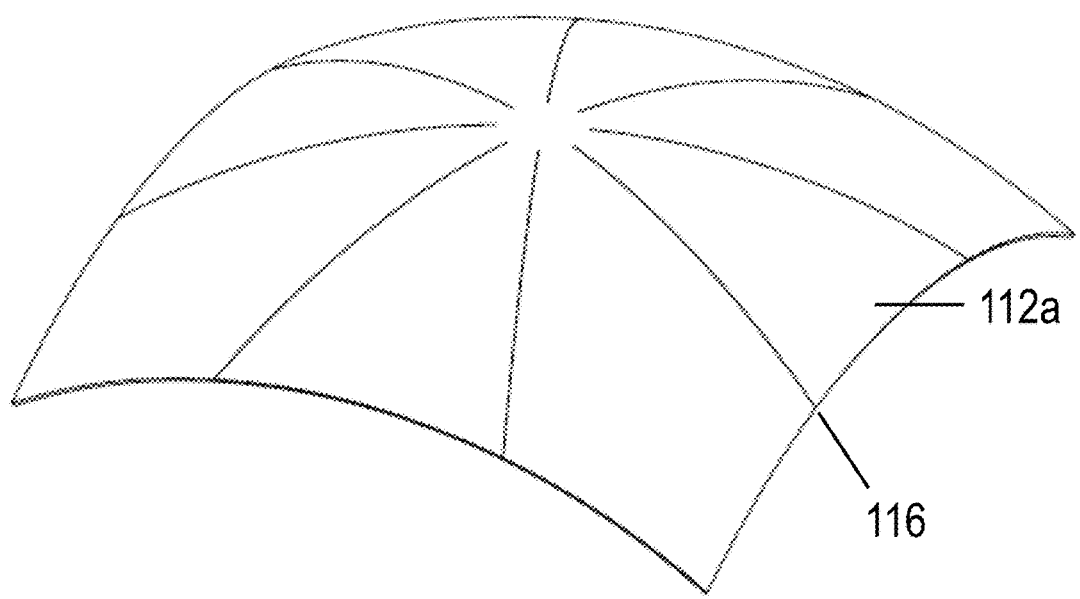
FIG. 9B illustrates a perspective view of an encapsulant sheet with relief cuts after draping onto a substrate, wherein the substrate is omitted for clarity, according to an embodiment of the present invention.

In step/station 402, the bottom aluminum tray may be placed robotically, manually, or via an ergonomic arm on the pallet, as the first layer of the lamination stack. In a preferred embodiment, the tray is placed robotically. In general, the bottom tray may be configured to align features and support the layers of the solar panel 100 during conveyance through the plant 400. In step/station 403, the substrate is robotically and/or manually placed on the bottom aluminum tray as the second layer of the lamination stack. In step/station 404, the bottom encapsulant layer may be laser cut and trimmed so as to conform to the complex curved surface of the substrate. An exemplary cutting pattern is illustrated in FIGS. 9A and 9B. The station may include a single conveyor laser cutter with a belted conveyor disposed proximate the cutter egress. The laser cutter may interface with the Manufacturing Execution System (MES). A purpose of the laser cutter is to mitigate wrinkles that may form in the encapsulant 112, as follows. A first flexible sheet of encapsulant material 112a may be draped over the convex substrate preform 120, as shown in FIG. 8. As the draped sheet 112a conforms to the doubly-curved, convex surface of the substrate preform 120, excess material may gather into folds, which may result in the trapping of air or apply excess localized pressure on a cell 210 of the solar cell array 200. One way to mitigate such wrinkling, in accordance with the present invention, involves employing the laser cutter to form, or otherwise cut a sheet of encapsulant such as is shown in FIGS. 9A and 9B. While still in sheet form, the conveyor laser cutter may make cuts 116 in the encapsulant layer 112a, and/or 112b, thereby forming gaps in the sheet, as shown in FIG. 9A. The cuts 116 may be shaped such that when the layer 112a is draped over the substrate 120, the cuts 116 rejoin and the gaps disappear, as shown in FIG. 9B. In this way folds in the encapsulant layer 112a may be reduced or eliminated, as well as any wrinkles. A similar approach may be used to avoid folds in the second, flexible sheet of encapsulant material 112b, visible in FIG. 8, as it is draped over the solar cell array 200, which, in turn, has been placed over the first encapsulant layer 112a. Human operators may remove or move the encapsulant 112, such as cut sheet 112a, 112b, and appropriately position the same on or relative to the substrate 120. Any waste from the laser cutting process may be removed and disposed of, or reformed and reused.

In step 405 generally, the solar cell array 200 is assembled, placed on the encapsulant layer 112 as the fourth layer of the lamination stack, and optionally tacked in place. This step 405 comprises a series of sub-steps that may run in parallel with the other operations in the factory. In step/station 405.1, individual solar cells are robotically assembled into rows and soldered together. The inputs for this step include the one or more solar cells 210 and the row interconnects 220, as in FIG. 8. Each solar cell 210 may be coupled to an adjacent cell 210 via soldering copper interconnect bars 220 therebetween. Each interconnect 220 may include three (3) soldering points per cell, for a total of six (6) soldering points between each pair of adjacent cells 210. This soldering may be accomplished automatically via a stinger machine that the solar cells 210 and interconnect bars 220 may be fed in to. In step/station 405.2, offloading of the completed solar cell strings may be accomplished robotically or manually, and the strings may be collected in an offload station. In step/station 405.3, a plurality of solar cell strings (rows) may be robotically arranged into an array 200. To fabricate the array, an operator may manually solder an interconnect "Z" bar 220 between neighboring solar cell rows, as displayed in FIG. 8. At this station, the operator may also solder a termination bar 250 to either end of the solar string of the array 200. An exemplary termination bar 250 is illustrated in FIG. 8. Also, at this station may be provided an electroluminescence (EL) Test, as detailed in Step 408. In step/station 405.4, rework to any solar cell array that fails the pre-lamination electroluminescence test may be performed. Depending on the test results, an operator may repair the array 200 accordingly. This may require resoldering interconnects 220, or even having to replace and resolder damaged solar cells 210. In step/station 405.5, the solar arrays are manually flipped face-up so that they face the top of the panel. An operator may manually flip the entire solar array 200 using a flip table. The objective of this station is to flip the array 200 for placement on the lamination stack while eliminating damage to, or misalignment of, the solar cell array 200 during the flipping procedure. In step/station 405.6, the solar arrays may be robotically picked flat, and placed curved, on the encapsulant layer 112. After the array 200 is placed, the same end effector may hold the array 200 in place while heat tacking occurs proximate the center of the cell 210. A robot station minimizes damage and/or misalignment of the array 200 with respect to the remaining stack thereunder. Another aspect of the present invention may include the use of fiducials, alignment features or datums to facilitate proper alignment of the layers forming the lamination stack. Fiducials may take the form of visual alignment indicators disposed on two or more surfaces of the layers forming the lamination stack, which may aid in manual or robotic alignment thereof. Alignment features may take the form of apertures or openings in one or more layers of the lamination stack, through which alignment rods, pins, etc., may pass. Datums may take the forms of edge features of the stack, such as a corner or jut-out, which may be temporarily aligned through a complementary abutment formed in the laminator. Fiducials may be utilized on any of the subcomponents, and surfaces thereof, as exemplified in FIGS. 10A-10D. In FIG. 10A for example, the laminate stack is displayed in unassembled component form comprising substrate 120, solar cell array 200, and superstrate 130. (Encapsulant layers have been omitted for clarity.) In this example, alignment marks 121 may be printed or otherwise marked on the substrate 120, in this case in the corners. In a first alignment, the solar cell array 200 is aligned to the substrate 120, as shown in FIG. 10B, and may subsequently be tacked 114 in place at the centers of the cells 210.

In step/station 406, after the cells are placed and tacked onto the curved lamination stack, electrical connections need to be made accessible on the underside of the panel. In this step, an opening is robotically cut in the substrate to allow the solar cell array termination to pass through to the other side of the panel. In step/station 407, the electrical terminations may be manually routed to the back of the panel, through the termination opening, for later connection to the junction boxes. In step/station 408, the solar cell array is subjected to electroluminescence (EL) test, which can reveal solder and cell defects. An Electroluminescence image may be captured to verify solar array 200. In this station, an operator may connect positive and negative leads of the solar array to a power supply to run current through the array 200. A special modified camera in a dark room may then be capable of capturing the EL image. This image may then be viewed by the operator and assigned a status, such as, for example, an "accept", "reject", or "accept with caution" status. In step/station 410 as in step 404, the top encapsulant layer, such as 112b of FIG. 8, may be laser cut and trimmed so as to conform to the complex curved surface of the substrate. The encapsulant sheet 112 may then be manually picked and placed on top of the solar cells, taking care to minimize both gaps and overlaps. The cut and placed encapsulant is the fifth layer of the lamination stack. In step/station 411, the top preform or substrate may be robotically placed on the top POE layer as the sixth layer of the lamination stack. In step/station 411, the top preform or substrate may be robotically placed on the top POE layer as the sixth layer of the lamination stack. Regarding alignment, in a second alignment, indicated in FIG. 10C, the superstrate 130 may be aligned to the substrate 120. For this step, complimentary alignment marks 131 are printed, or otherwise marked, on the superstrate 130 in the corners. The resulting aligned fiducials and layers may be seen in the detail view of FIG. 10D, where an aligned solar cell 210 touches the substrate cross 121 at its corners. Also visible, the superstrate fiducial 131 is symmetrically juxtaposed over the substrate fiducial 121. Since at this point there remain significant gaps between the layers (due to the flat solar cells 210), viewing the fiducials from the local surface normal may produce parallax-induced misalignment. While manual alignment is possible, a preferred method would be the use of machine vision to guide a robotic placement of the array. For the latter approach, machine readable fiducials are required. In step/station 412, as in this step 402 with respect to the bottom tray, in this step the top aluminum tray may be robotically placed on the superstrate 130 as the seventh and final layer of the lamination stack. As before, a cleaning step may be executed prior to placement, as needed.

In step/station 413, the full lamination stack may be robotically placed in the laminator 300 and all layers laminated to form a solar panel 100. The lamination station 413 may include 8 laminators (6 small, 2 large) 300 for lamination of the solar panels 100. A robot located on, and moveable along, a rail may pick up lamination stacks from conveyance pallets and place the lamination stack in an appropriate laminator 300. When the laminations are complete, the robot may then pick up the completed laminations and place them on a conveyor pallet. Each laminator 300 may have a removable male mold on their platens that has alignment features on it, and the laminators 300 may be of a clam shell and/or vertical upstroke press variety. In step/station 414, the full lamination stack may be robotically removed from a respective laminator 300 of laminator station 413 and automatically conveyed to a cooling station, where it is cooled to the point where the trays may be separated from the panel. After lamination, the lamination stack, including trays, will have an internal temperature of about 155° C., and require cooling to room temperature before further work is conducted. To do this, an active cooling station may be used, such as fans or other methods may be installed for active cooling above and/or below the production line.

In step/station 415.1, the top aluminum tray may be manually/robotically removed and returned to the cleaning and loading zone, 401. In step/station 415.2, the bottom aluminum tray is manually/robotically removed and returned to the cleaning and loading zone, 401. In step/station 416, operators may remove the laminated solar panel 100 from the conveyance system onto a visual inspection rack. The operator may then scan the associated pallet to initiate printing of the panel ID and barcode via a label printer machine. During the lamination process, the solar panel may produce external flash that must be removed. At station/step 417, the panels 100 may be fed into an edge trimmer, wherein one robot will place the panel onto a cutting fixture, and a second robot will trim the edges on the fixture with a laser cutter. In step/station 418, the panel and all of its components are visually inspected for defects. The solar panel may be placed on a vertical rack for optimal inspection. Once the operator completes their visual inspection, they may confirm on an operator screen whether the panel is acceptable or needs to be rejected.

In step/station 419, the solar array termination may be fed into a junction box and soldered thereto. The junction box may also be attached to the solar panel 100 at each end of the solar cell array 200 proximate the termination ends 250. The termination 250 exiting the panel may be threaded through the corresponding slot on the junction box. The junction box may then be affixed to the panel 100 using double-sided, high bond tape. Next, the terminal 250 may be trimmed to an appropriate length to allow soldering. Finally, the terminal 250 may be soldered to the junction box soldering pad. The type of panel being produced will dictate the number of junction boxes required. For example, in preferred embodiments, the hood may have two junction boxes, the dash may have two junction boxes, the roof may have four, and the rear hatch may have six junction boxes. In step/station 420, the junction box may be potted and cured with a protective compound, which may shield the solar panel termination points from environmental damage and/or corrosion. At this station, operators may utilize a UV-cured potting compound to pot the termination point in each junction box. Operators may first dispense the compound, and then continue with the application of a UV cure light surrounding the mix. In step/station 421.1 as in step 408, the solar cell array 200 of laminated solar panel 100 may be subjected to a second electroluminescence (EL) test, which can reveal solder and cell defects resulting from, inter alia, the lamination process. In step/station 421.2 the solar panel 100 may be put through a solar sun simulator machine to measure the power rating of the panel. This may be accomplished manually by an operator who places the solar panel into the simulation machine. In step/station 421.3, the solar panel 100 is tested for mechanical compliance with the support structure. The solar panel 100 may be checked to verify the shape and dimensions are acceptable and meet the predetermined solar panel specifications. An operator may place the panel onto a check fixture to perform this task. Once on the fixture, a 3D scanner may be used to capture a 3D image of the panel, which will be used to verify the shape and dimensions.

In step/station 422, each solar panel 100 may be sealed along the laminate edges, and a substructure may be coupled to the panel where necessary. For example, the hood and rear hatch panel may require that a substructure needs to be adhered to the bottom surface of the panel. To achieve this step, two operators may take a solar panel 100 from the conveyor line and flip it onto an alignment and holding fixture, with cells 210 facing down. If the panel 100 requires a sub-structure, operators may manually apply a structural adhesive to the bottom surface of the panel, and/or adhesive tape for handling purposes. Two operators may then take the substructure corresponding to the panel, e.g., the hatch or the hood, from a nearby pallet and place it onto the bottom of the panel 100. After the panel 100 has been adhered to the substructure, a sealing adhesive layer will be manually applied along the outer edge of the panel 100. The panel 100 may then be returned to the conveyance line.

In step/station 423, the solar cell panel is placed on pallets or racks for shipment to the automobile production facility. It should be noted that there may be several stations which may act as buffers between steps and stations with different cycle times. These may include, for example, a panel overflow, a substrate pick and place, an encapsulant pick and place, a solder rework, and top and bottom tray pick and place.

The previous description of the disclosed embodiments is provided to enable any person skilled in the art to make or use the invention. Various modifications to these embodiments will be readily apparent to those skilled in the art, and the generic principles defined herein can be applied to other embodiments without departing from the spirit or scope of the invention. It is therefore desired that the present embodiments be considered in all respects as illustrative and not restrictive, reference being made to the appended claims as well as the foregoing descriptions to indicate the scope of the invention.

What is claimed is:

1. A method for continuously producing a laminated solar panel product, the method comprising:
   providing a preformed substrate oriented so that the convex surface faces upwardly;
   disposing a first encapsulant proximate said convex surface of said preformed substrate, so that said first encapsulant substantially conforms to said convex surface thereof;
   disposing a solar cell array proximate said first encapsulant, said solar cell array being manufactured by steps comprising:
      coupling an interconnect between two adjacent solar cells to form a row comprising a plurality of solar cells;
      coupling a Z-bar interconnect between two adjacent solar cells, each adjacent solar cells being formed within an adjacent row of solar cells, to form said solar cell array comprising at least two rows, wherein said coupling said Z-bar interconnect between said two adjacent solar cells and said coupling said interconnect between said two adjacent solar cells face upwardly, and coupling a termination bar to said solar cell at both ends of said solar cell array;
      flipping said solar cell array so that said coupling said Z-bar interconnect between said two adjacent solar cells, and said coupling said interconnect between said two adjacent solar cells, face downwardly;
      picking said solder cell array; and
      placing said solar cell array proximate said first encapsulant so that said solar cells of said solar cell array substantially conform to said first encapsulant;
   cutting at least one termination opening through said preformed substrate;
   routing said each of said termination bars of said solar cell array through said at least one terminal opening, such that said termination bars remain electrically decoupled;
   disposing a second encapsulant proximate said solar cell array, so that said second encapsulant substantially conforms to said solar cell array;
   disposing a preformed superstrate proximate said second encapsulant, wherein said preformed substrate and said preformed superstrate forma complementary shape when arranged in an assembled configuration, thereby forming a lamination stack;
   laminating said lamination stack in a laminator to produce a solar cell;
   trimming at least one edge of said solar panel;
   feeding said termination bars of said solar cell array through a junction box and soldering said termination bars to said junction box; and
   potting said junction box to form said laminated solar panel product.

2. The method for continuously producing a laminated solar panel product according to claim 1, wherein said placing said solar cell array proximate said first encapsulant so that said solar cells of said solar cell array at least partially conform to said first encapsulant, further comprises heat tacking one or more solar cells to said preformed substrate by heating said first encapsulant.

3. The method for continuously producing a laminated solar panel product according to claim 1, wherein said laminating said lamination stack in a laminator to produce a solar panel, further comprises laminating said lamination stack so that at least one solar cell of the solar cell array is curved along two orthogonal axes.

4. The method for continuously producing a laminated solar panel product according to claim 3, wherein said laminating applies uniform pressure across the at least one solar cell of the solar cell array curved along two orthogonal axes.

5. The method for continuously producing a laminated solar panel product according to claim 4, wherein as said laminator begins applying pressure to said lamination stack, said preformed substrate initially moves said cell at said downward-facing side center, and said preformed superstrate simultaneously moves said cell at said upward-facing side corners, thereby bending said cell by applying said substantially uniform pressure.

6. The method for continuously producing a laminated solar panel product according to claim 1, further comprising providing a bottom tray, wherein said providing a preformed substrate oriented so that the convex surface faces upwardly, comprises disposing said preformed substrate proximate said bottom tray.

7. The method for continuously producing a laminated solar panel product according to claim 6, further comprising disposing a top tray proximate said preformed superstrate.

8. A solar panel plant having a plurality of manufacturing stations comprising:
   at a preparation station, providing a preformed substrate oriented so that the convex surface faces upwardly;
   at a first encapsulant station, disposing a first encapsulant proximate said convex surface of said preformed substrate, so that said first encapsulant at least partially conforms to said convex surface thereof;
   at a solar cell array station, disposing a solar cell array proximate said first encapsulant, said solar cell array being manufactured by steps comprising:
      at an auto-string station, coupling an interconnect between two adjacent solar cells to form a row comprising a plurality of solar cells;
      at a bar station, coupling a Z-bar interconnect between two adjacent solar cells, each adjacent solar cell being formed within an adjacent row of solar cells, to form said solar cell array comprising at least two rows, wherein said coupling said Z-bar interconnect between said two adjacent solar cells and said coupling said interconnect between said two adjacent solar cells face upwardly, and coupling a termination bar to said solar cell at both ends of said solar cell array;
      at a flip table station, flipping said array of solar cells so that said coupling said Z-bar interconnect between said two adjacent solar cells, and said coupling said interconnect between said two adjacent solar cells, face downwardly; and
      at a pick-flat, placed-curved station, picking said solar cell array, and placing said solar cell array proximate said first encapsulant so that said solar cells of said solar cell array at least partially conform to said first encapsulant;
   at a termination opening cutting station, cutting at least one termination opening through said preformed substrate;
   at a termination routing station, routing said each of said termination bars of said solar cell array through said at least one terminal opening, such that said termination bars remain electrically decoupled;
   at a second encapsulant station, disposing a second encapsulant proximate said solar cell array, so that said second encapsulant at least partially conforms to said solar cell array;
   at a superstrate station, disposing a preformed superstrate proximate said second encapsulant, wherein said preformed substrate and said preformed superstrate form a complementary shape when arranged in an assembled configuration, thereby forming a lamination stack;
   at a laminator station, laminating said lamination stack in a laminator to produce a solar panel;
   at an edge trimming station, trimming at least one edge of said solar panel;
   at a junction box feed and solder station, feeding said termination bars of said solar cell array through a junction box and soldering said termination bars to said junction box; and
   at a junction box potting station, potting said junction box to form a laminated solar panel product.

9. The solar panel plant having a plurality of manufacturing stations according to claim 8, wherein said pick-flat, placed curved station further comprises heat tacking one or more solar cells to said preformed substrate by heating said first encapsulant.

10. The solar panel plant having a plurality of manufacturing stations according to claim 8, wherein said laminating said lamination stack in a laminator to produce a solar panel, further comprises laminating said lamination stack so that at least one solar cell of the solar cell array is curved along two orthogonal axes.

11. The solar panel plant having a plurality of manufacturing stations according to claim 10, wherein said laminating applies uniform pressure across the at least one solar cell of the solar cell array curved along two orthogonal axes.

12. The solar panel plant having a plurality of manufacturing stations according to claim 11, wherein as said laminator begins applying pressure to said lamination stack, said preformed substrate initially moves said cell at said downward-facing side center, and said preformed superstrate simultaneously moves said cell at said upward-facing side corners, thereby bending said cell by applying said uniform pressure.

13. The solar panel plant having a plurality of manufacturing stations according to claim 8, wherein said preparation station further comprises providing a bottom tray, and wherein said providing a preformed substrate oriented so that the convex surface faces upwardly, comprises disposing said preformed substrate proximate said bottom tray.

14. The solar panel plant having a plurality of manufacturing stations according to claim 13 further comprises at a top tray station, disposing a top tray proximate said preformed superstrate.

* * * * *